United States Patent
Gill et al.

(10) Patent No.: US 7,723,823 B2
(45) Date of Patent: May 25, 2010

(54) BURIED ASYMMETRIC JUNCTION ESD PROTECTION DEVICE

(75) Inventors: Chai Ean Gill, Chandler, AZ (US);
Changsoo Hong, Phoenix, AZ (US);
James D. Whitfield, Gilbert, AZ (US);
Rouying Zhan, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 146 days.

(21) Appl. No.: 12/178,800

(22) Filed: Jul. 24, 2008

(65) Prior Publication Data

US 2010/0019341 A1    Jan. 28, 2010

(51) Int. Cl.
*H01L 23/62* (2006.01)

(52) U.S. Cl. .............. 257/565; 257/557; 257/592; 257/593; 257/362; 257/355; 257/E27.023; 257/E29.174; 257/E27.053; 257/577; 257/360

(58) Field of Classification Search ........... 257/355, 257/358, 565, 557, 592, 593, 362, 577, E27.023, 257/E29.174, E27.053
See application file for complete search history.

(56) References Cited

U.S. PATENT DOCUMENTS

| | | | |
|---|---|---|---|
| 6,177,717 B1 * | 1/2001 | Chantre et al. | 257/565 |
| 6,717,219 B1 | 4/2004 | Vashchenko et al. | |
| 6,891,230 B2 | 5/2005 | Yu | |
| 7,221,036 B1 * | 5/2007 | Vashchenko et al. | 257/565 |

* cited by examiner

*Primary Examiner*—Wael Fahmy
*Assistant Examiner*—Marc Armand
(74) *Attorney, Agent, or Firm*—Ingrassia, Fisher & Lorenz, P.C.

(57) ABSTRACT

An improved lateral bipolar electrostatic discharge (ESD) protection device (40) comprises a semiconductor (SC) substrate (42), an overlying epitaxial SC layer (44), emitter-collector regions (48, 50) laterally spaced apart by a first distance (52) in the SC layer, a base region (54) adjacent the emitter region (48) extending laterally toward and separated from the collector region (50) by a base-collector spacing (56) that is selected to set the desired trigger voltage Vt1. By providing a buried layer region (49) under the emitter region (48) Ohmically coupled thereto, but not providing a comparable buried layer region (51) under the collector region (50), an asymmetrical structure is obtained in which the DC trigger voltage ($Vt1_{DC}$) and transient trigger voltage ($Vt1_{TR}$) are closely matched so that $|Vt1_{TR}-Vt1_{DC}|\sim 0$. This close matching increases the design margin and provides a higher performance ESD device (40) that is less sensitive to process variations, thereby improving manufacturing yield and reducing cost.

20 Claims, 2 Drawing Sheets

BURIED ASYMMETRIC JUNCTION ESD PROTECTION DEVICE

FIELD OF THE INVENTION

The present invention generally relates to semiconductor (SC) devices and integrated circuits (ICs) and, more particularly, structures and methods for forming electrostatic discharge (ESD) protection devices for ICs and other SC and non-SC devices.

BACKGROUND OF THE INVENTION

FIG. 1 shows simplified plot 20 of transmission line pulse current (I) versus voltage (V) for a typical electrostatic discharge (ESD) protection device. As the applied voltage is increased, very little current flows until triggering voltage 21 is reached at voltage Vt1. Once triggered into operation, the ESD device conducts and the current increases to holding point 22 with current Ih and voltage Vh. Depending upon the internal impedance of the voltage source, current and voltage may further increase to point 23 at current It2 and voltage Vt2, beyond which destructive failure may occur leading to further current increase accompanied by voltage decrease. Electrostatic discharge (ESD) protection devices are intended to remain quiescent during normal operation of an associated semiconductor (SC) device(s) or non-SC device(s) or integrated circuit (IC), i.e., the "protected element(s)", having a normal operating voltage Vo, but turn on when excessive voltage arises, thereby preventing damage to the protected element(s). The triggering voltage Vt1 of the ESD device should exceed the maximum normal DC operating voltage Vo(MAX) of the protected elements, otherwise the ESD device will interfere with normal operation of the protected elements. Further, Vt1 should be less than, for example, a voltage $V_{TR}$ (usually a transient voltage) large enough to damage the protected element(s), hereafter referred to as the protected element break-down voltage, abbreviated as $V_{TR}$(PEBD). Thus, the ESD device should be designed so that Vo(MAX)<Vt1<$V_{TR}$(PEBD).

One of the difficulties of using bipolar transistors for ESD devices is that their turn-on voltages Vt1 for DC operation (i.e., $Vt1_{DC}$) and transient operation (i.e., $Vt1_{TR}$) are often different, i.e., $Vt1_{DC}$ is not equal to $Vt1_{TR}$. This has the consequence of reducing the margin between the maximum DC operating voltage that can be applied to the circuit in normal operation without triggering the ESD device and the transient ESD voltage that can trigger the ESD device into operation to provide protection against excessive voltage. It is desirable to have the DC and transient trigger voltages of the ESD device be as nearly equal as possible. However, with current day devices, this is often difficult or impossible to achieve.

Thus, a need continues to exist for improved structures and methods for ESD protection devices in which the voltage margin of the ESD structures is improved by decreasing the difference ($\Delta V = |Vt1_{TR} - Vt1_{DC}|$) between the transient ESD turn-on voltage $Vt1_{TR}$ and DC ESD turn-on voltage $Vt1_{DC}$. This improvement has a further desirable consequence of improving the tolerance of the ESD protection devices to random process variations that can occur during SC device and/or IC manufacture, which might otherwise shift the DC ESD turn-on voltage $Vt1_{DC}$ below the maximum DC operating voltage of the protected element(s) Vo(MAX) or increase the transient ESD turn-on voltage $Vt1_{TR}$ above the maximum (no-damage) voltage tolerance of the protected element(s) $V_{TR}$(PEBD). Either of such conditions can cause rejection of the finished devices, thereby lowering overall manufacturing yield and increasing overall manufacturing cost.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
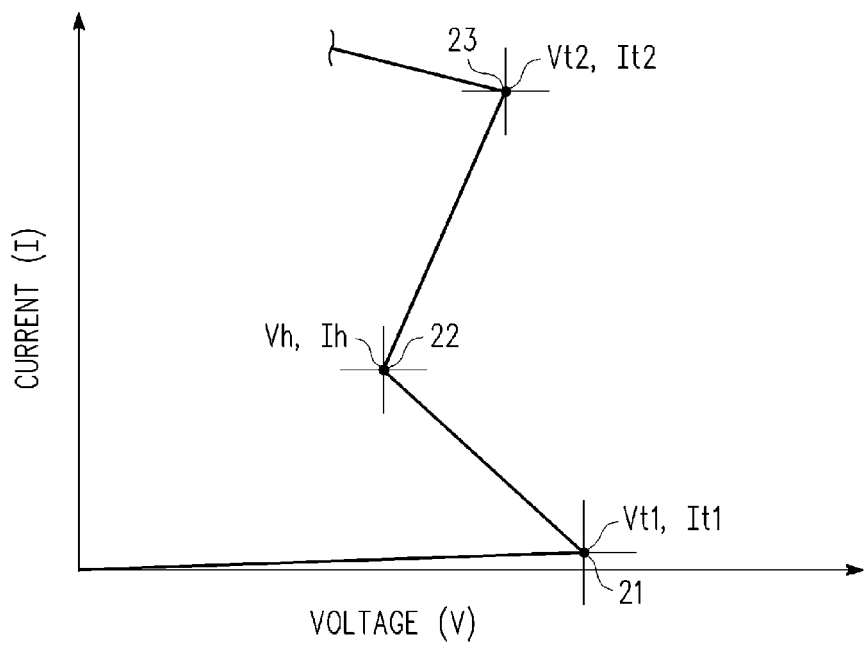
FIG. 1 is a simplified plot of current versus voltage for a typical electrostatic discharge (ESD) protection device.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the term "semiconductor" is intended to include any semiconductor, including non-type IV compound semiconductors, organic semiconductors and inorganic semiconductors, and the terms "substrate" and "semiconductor substrate" are intended to include single crystal structures, polycrystalline structures, thin film structures, layered structures as for example and not intended to be limiting semiconductor-on-insulator (SOI) structures, and combinations thereof. The term "semiconductor" is abbreviated as "SC." For convenience of explanation and not intended to be limiting, the semiconductor ESD protection devices and methods of fabrication are described herein for N-type silicon based bipolar devices, that is NPN bipolar silicon transistors, but persons of skill in the art will understand that the invention described herein can be used with other semiconductor materials, PNP transistors and device types.

The various embodiments of the invention described herein are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows and the claims may be more generally referred to as of a "first conductivity type" and a "second" opposite conductivity type", where the first conductivity type may be either N or P type and the second opposite conductivity type is then either P or N type, and so forth.

Figure 2:
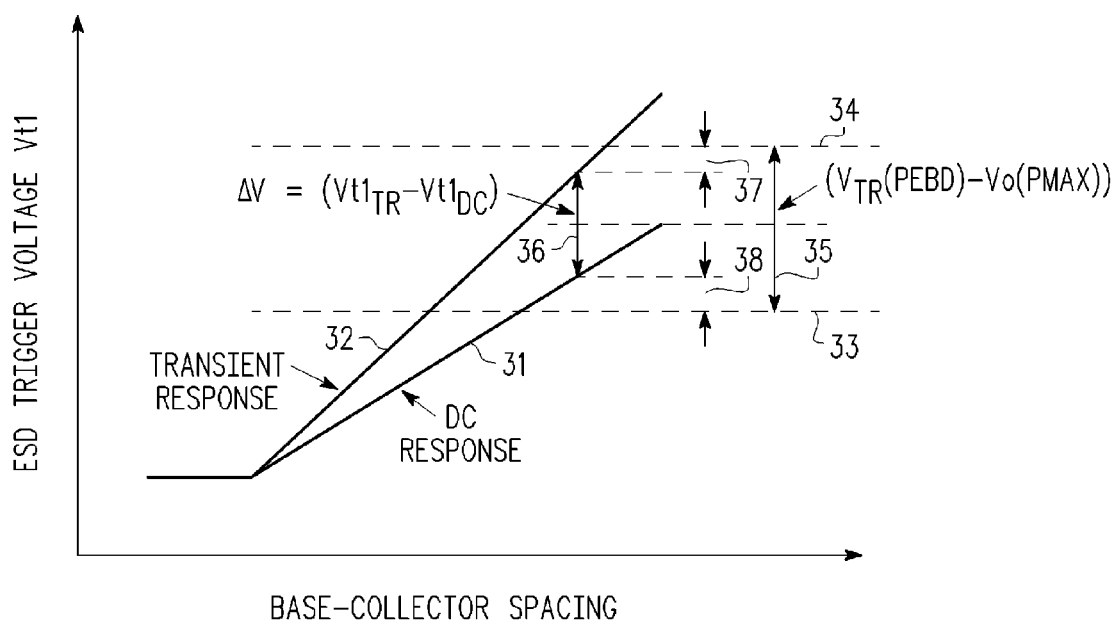
FIG. 2 is a plot of ESD trigger voltage for DC and transient voltages as a function of base-collector spacing of a lateral bipolar ESD transistor, illustrating how different DC and transient ESD voltage values adversely affect the ESD design margin.

FIG. 2 shows plot 30 of ESD trigger voltage Vt1 for DC trigger voltages $Vt1_{DC}$ and transient trigger voltages $Vt1_{TR}$ as a function of base-collector spacing of a lateral NPN bipolar ESD transistor, illustrating how different DC and transient ESD voltage values can adversely affect the ESD protection device design margin. Trace 31 shows the variation of DC trigger voltages $Vt1_{DC}$ and trace 32 shows the variation of transient trigger voltages $Vt1_{TR}$ for a conventional device. The total available ESD protection device design range or design margin (abbreviated as TADR) is given by Eq. 1 below:

$$\text{Total Available Design Range (TADR)} = |(V_{TR}(PEBD) - Vo(PMAX))| - |(Vt1_{TR} - Vt1_{DC})|, \quad \text{Eq. 1}$$

where $V_{TR}(PEBD)$ is the "not-to-exceed" breakdown voltage of the protected element(s), Vo(PMAX) is the maximum operating voltage of the protected elements, and $Vt1_{TR}$ and $Vt1_{DC}$ are, as explained above, the transient and the DC trigger voltages of the ESD protection device. To the extent that $\Delta V = |Vt1_{TR} - Vt1_{DC}| > 0$, the Total Available Design Range (TADR) is made smaller, which is undesirable. This can be understood graphically by referring to plot 30. Assume, that $|(V_{TR}(PEBD) - Vo(PMAX))|$ has the value indicated by voltage difference 35 between traces 33, 34 at the right side of plot 30 and that $\Delta V = |(Vt1_{TR} - Vt1_{DC})|$ has the value shown by voltage difference 36 between traces 31, 32 toward the left of plot 30. Then, the TADR is given by the voltage differences 37, 38. Conversely, if $\Delta V = |(Vt1_{TR} - Vt1_{DC})| \sim 0$, where both DC and transient trigger voltages VT1 follow, for example trace 31, then the TADR is given by voltage differences 37, 38, that is, $TADR = |(V_{TR}(PEBD) - Vo(PMAX))|$. Under the latter circumstances (i.e., $\Delta V \sim 0$), it is much easier to design ESD protection devices that are less susceptible to manufacturing process variations, resulting in improved performance, higher manufacturing yield and lower cost. This is highly desirable.

Figure 3:
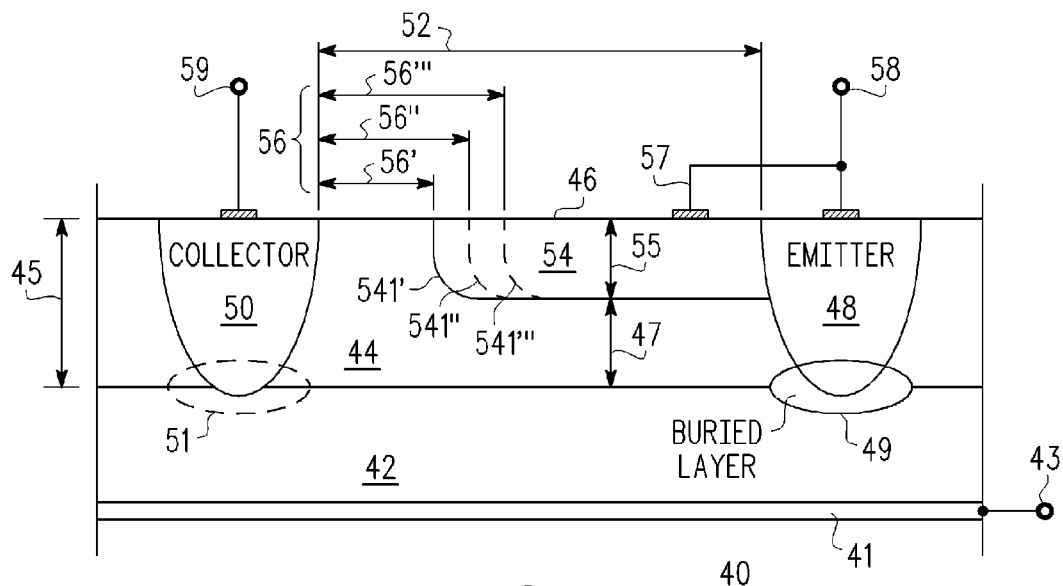
FIG. 3 is a simplified schematic cross-sectional view of a lateral bipolar electrostatic discharge (ESD) protection device according to the present invention and illustrating how it differs from conventional ESD protection devices.

FIG. 3 is a simplified schematic cross-sectional view of NPN lateral bipolar electrostatic discharge (ESD) protection device 40 according to the present invention and illustrating how it differs from conventional ESD protection devices. For convenience of explanation, device 40 is illustrated as an NPN transistor. However, persons of skill in the art will understand that with appropriate changes in the conductivity type of the various regions and the polarity of applied signals, that a PNP transistor or other type of semiconductor device could also be used. Device 40 comprises P-type substrate 42 with back-side contact 41 and terminal 43. Substrate 42 usefully has doping in the range of about 8E14 to 8E18 impurity atoms/cm$^3$, more conveniently in the range of about 8E14 to 8E16 impurity atoms/cm$^3$, and preferably about 1E15 to 1E16 impurity atoms/cm$^3$, but lower and higher values can also be used. Silicon is a useful material for substrate 42 but other semiconductor materials can also be used. Overlying substrate 42 is P-layer 44 of thickness 45 extending to surface 46. Layer 44 is desirably an epi-layer, but in other embodiments, may be provided by other techniques well known in the art. Thickness 45 is usefully in the range of about 2 to 10 micrometers, more conveniently about 3 to 6 micrometers and preferably about 5 micrometers, but thicker and thinner layers can also be used. Layer 44 usefully has doping in the range of about 8E14 to 8E15 impurity atoms/cm$^3$, more conveniently in the range of about 1E15 to 4E15 impurity atoms/cm$^3$, and preferably about 1E15 to 2E15 impurity atoms/cm$^3$, but lower and higher values can also be used, depending upon the particular device properties desired. In general, layer 44 may be somewhat more lightly doped than substrate 42, usefully with doping in the range of about 1E-03 less, more conveniently about 1E-02 less and preferably about the same to 1E-01 less than the doping of substrate 42. Located within layer 44 and extending from surface 46 substantially to or into P-substrate 42, are spaced-apart N-type regions 48, 50 which serve, respectively, as the emitter and collector of lateral device 40. Emitter region 48 has contact 58 and collector region 50 has contact 59. Regions 48, 50 are usefully doped to about 8E16 to 8E19 impurity atoms per cm$^3$, more conveniently to about 8E17 to 1E19 impurity atoms per cm$^3$, and preferably to about 8E18 impurity atoms per cm$^3$. Stated another way, regions 48, 50 are usefully doped to about 1E02 to 1E05 times greater than the doping level of region 44, more conveniently to about 1E02 to 1E04 times greater than the doping level of region 44 and preferably about 1E03 times greater then the doping level of region 44. The doping of regions 48, 50 may be the same or different in different embodiments. Regions 48, 50 are spaced apart by distance 52 of for example, usefully about 3 to 15 micrometers, more conveniently about 3 to 10 micrometers and preferably at least about 4 micrometers, but higher and lower values may also be used depending upon the desired device properties.

Located within layer 44 between emitter-collector regions 48, 50 is P-well region 54 extending to depth 55 below surface 46, which is desirably doped somewhat more heavily than layer 44. P-well region 54 usefully has doping in the range of to about 2E16 to 8E19 impurity atoms/cm$^3$, more conveniently in the range of about 6E16 to 5E18 impurity atoms/cm$^3$, and preferably about 1E17 to about 1E18 impurity atoms/cm$^3$, but lower and higher values can also be used. Stated another way, P-well region 54 is usefully doped in the range of about 1E0 to 1E05 times, more conveniently about 1E0 to 1E03 times and preferably about 1E0 to 2E02 times the doping of layer 44. Depth 55 is desirably in the range of about 1.5 to 3.3 micrometers, more conveniently in the range of about 2.0 to 2.8 micrometers and preferably about 2.4 micrometers, but higher or lower values can also be used. Stated another way, depth 55 is usefully about 30 to 66 percent, more conveniently about 40 to 50 percent and preferably about 48 percent of thickness 45 of layer 44. P-well region 54 is separated from substrate 42 by distance 47. The right-hand end of P-well region 54 abuts emitter region 48 and left-hand end 541', 541'', 541''' (collectively 541) is separated from collector region 50 by lateral base-collector spacing 56', 56'', 56''', collectively 56. As indicated by the dashed lines, base-collector spacing 56 can take on different values 56', 56'', 56''', etc. (collectively 56) depending upon the desired values of Vt1 (e.g., see FIGS. 2, 4-5). Base-collector spacing 56 in the range of about 0 to 3 micrometers are useful depending on the desired trigger voltage Vt1, but higher and lower values can also be used. Stated another way, base-collector spacing 56 is desirably 0 to 50 percent of emitter collector separation 52. P-well region 54 and emitter region 48 are desirably shorted together by surface connection 57. Buried layer region 49 of doping of the same type and generally greater than emitter region 48 is desirable provided locally beneath emitter region 48 with, for example, a lateral width about the same as emitter region 48 at surface 46. Buried layer region 49 usefully has a doping level usefully about 1 to 10 times, more conveniently about 2 to 6 times and preferably about 3 to 5 times the doping level of emitter region 48.

In the prior art, analogous buried layer region 51 (shown by the dashed lines) is also provided beneath collector region 50. However, collector buried layer region 51 is omitted in the present invention, which omission contributes to the improved properties observed for the embodiments of the invention described herein. The absence of buried layer region 51 beneath collector region 50 produces devices wherein the DC trigger voltage $Vt1_{DC}$ and transient trigger voltage $Vt1_{TR}$ are much closer together, that is $\Delta V=|(Vt1_{TR}-Vt1_{DC})|$ is small compared to Vt1. Stated another way, the ratio $(\Delta V)/(Vt1_{TR})$ desirably has a magnitude less than or equal to about 25 percent, more conveniently less than or equal to about 15 percent and preferably less than or equal to about 10 percent. This greatly improves overall performance and design margin for the ESD protection device.

Figure 4:
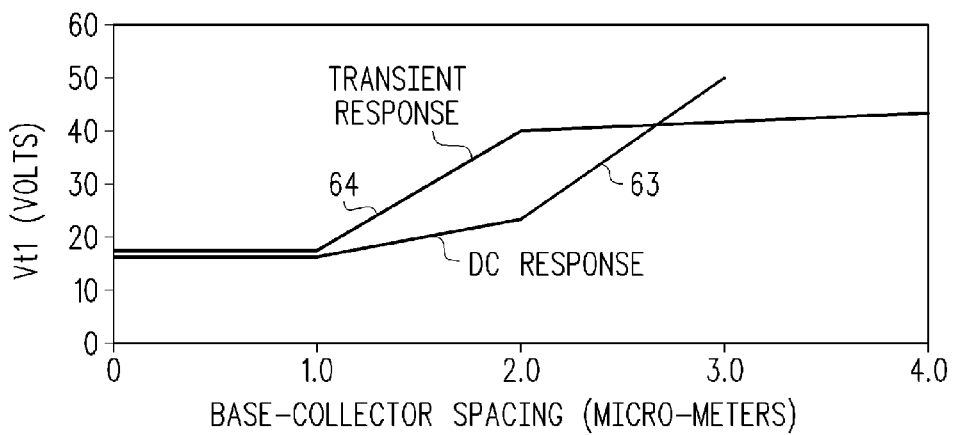
FIGS. 4 and 5 are simplified plots of ESD trigger voltage Vt1 versus base-collector spacing of lateral bipolar ESD devices without and with the features of the present invention.
Figure 5:
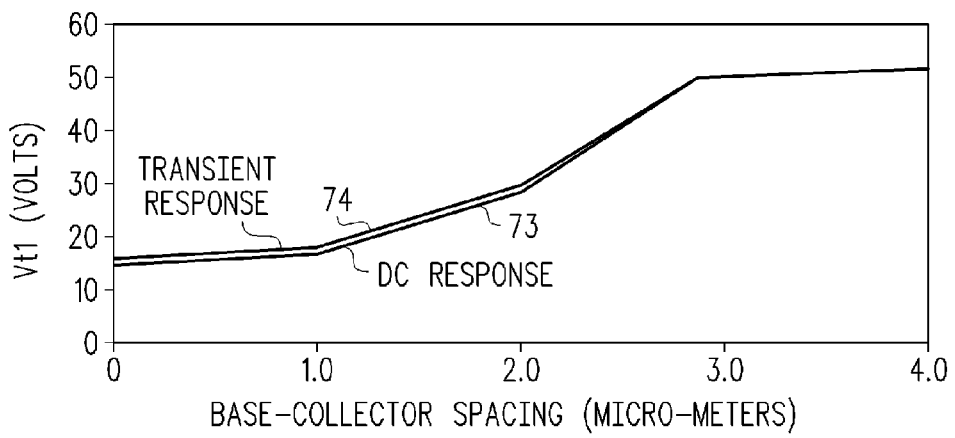

FIGS. 4 and 5 are simplified plots of ESD trigger voltage Vt1 versus base-collector spacing 56 of lateral bipolar ESD devices. FIG. 4 shows plot 60 for a device including sub-collector buried layer 51. It will be noted that trace 63 for DC trigger voltage $Vt1_{DC}$ differs significantly for base-collector spacing 56 above about 1.0 micrometers from trace 64 for transient trigger voltage $Vt1_{TR}$. FIG. 5 shows plot 70 from an otherwise generally similar device according to an embodiment of the present invention in which sub-collector buried layer 51 is omitted. It will be noted that trace 73 for DC trigger voltage $Vt1_{DC}$ is substantially the same for various base-collector spacings 56 as trace 74 for transient trigger voltage $Vt1_{TR}$. Thus, for the device of plot 70, $\Delta V=|Vt1_{TR}-Vt1_{DC}|$ is small, in fact near zero. This is highly desirable. By adjusting base-collector spacing 56, the trigger voltage Vt1 can be set to various predetermined values over a substantial voltage range, e.g., from 15 to 50 volts for the device of FIG. 5. By adjusting the doping and dimensions of the various device regions according to principals well known in the art and/or by cascading devices, other voltage ranges may be obtained. Devices prepared according to embodiments of the inventions described herein provided holding currents in the range of 1E-01 to 3E-01 amps and exhibit very low leakage, for example, in the range of 1E-13 to 1E-07 amps for voltages below the trigger voltages. Stated another way, the invented devices exhibit leakage currents for voltages below the ESD trigger voltages that are about $10^{-14}$ to $10^{-1}$ times their ability to non-destructively sink ESD currents once triggered. This is an important property since it is highly desirable that the ESD protection device be substantially electrically invisible at voltages below the trigger voltage so as to not interfere with the ordinary operation of the protected elements and yet be able to sink large ESD currents once triggered. The invented devices described herein exhibit these desirable properties.

According to a first embodiment, there is provided a lateral electrostatic discharge (ESD) protection device (40), comprising, a semiconductor substrate (42) of a first conductivity type and first doping level, a semiconductor layer (44) overlying the substrate (42), and of the first conductivity type and a second doping level and having an outer surface (46) spaced a first distance (45) from the substrate (42), emitter (48) and collector (50) regions of a second, opposite, conductivity type, laterally spaced apart by a second distance (52), and having third doping level greater than the second doping level, a well region (54) of the first conductivity type in but not extending through the semiconductor layer (44) and having a doping level higher than the second doping level but less than or equal to the third doping level, and extending laterally from the emitter region (48) toward but separated from the collector region (50) by a third distance (56), and a buried layer (49) of the second conductivity type and doping level higher than the third doping level Ohmically coupled to the emitter region (48), and without a further buried layer (51) of the second conductivity type Ohmically coupled to the collector region (50). According to a further embodiment, the first conductivity type is N-type. According to a still further embodiment, the buried layer (49) Ohmically coupled to the emitter region (48) has a lateral width substantially similar to a lateral width of the emitter region (48). According to yet further embodiment, the well region (54) has a depth (55) from the exterior surface toward the substrate (42) of about 30 to 60 percent of the first distance (45). According to a still yet further embodiment, the third distance (56) is about 0 to 50 percent of the second distance (52). According to a yet still further embodiment, the third distance (56) is in the range of about 0 to 3 micrometers. According to another embodiment, a DC ESD trigger voltage $Vt1_{DC}$ and a transient ESD trigger voltage $Vt1_{TR}$ differ in magnitude by less than about 25 percent of $Vt1_{TR}$. According to a still another embodiment, the buried layer region (49) underlies the emitter region (48). According to a yet another embodiment, the emitter region (48) and the collector region (50) extend substantially through the semiconductor layer (44).

According to a second embodiment, there is provided a lateral bipolar electrostatic discharge (ESD) protection device (40) having a trigger voltage Vt1, comprising, a semiconductor (SC) substrate (42), an overlying epitaxial SC layer (44), emitter-collector regions (48, 50) in the SC layer (44), laterally spaced apart by a first distance (52), a base region (54) adjacent the emitter region (48) in the epitaxial SC layer (44) extending laterally toward and separated from the collector region (50) by a base-collector spacing (56) in the epitaxial layer (44), which base-collector spacing (56) is chosen to set a predetermined ESD trigger voltage Vt1, and a buried layer region (49) under the emitter region (48) Ohmically coupled thereto, but without a comparable buried layer region (51) under the collector region (50), thereby providing an asymmetrical structure whose DC trigger voltage ($Vt1_{DC}$) and transient trigger voltage ($Vt1_{TR}$) are approximately equal. According to a further embodiment, the buried layer region (49) extends laterally under the emitter region (48). According to a still further embodiment, the buried layer region (49) is more heavily doped than the emitter region (48). According to a yet further embodiment, the base-collector spacing (56) is in the range of about 0 to 50 percent of the first distance (52). According to a still yet further embodiment, the epitaxial SC layer has a first thickness and the base region extends to a first depth from an outer surface of the epitaxial SC layer, which first depth is about 30 to 60 percent of the first thickness. According to a yet still further embodiment, the substrate (42) has a first dopant concentration, the epitaxial layer (44) has a second dopant concentration equal or less than the first dopant concentration and the base region (54) has a third dopant concentration greater than the second dopant concentrations.

According to a third embodiment, there is provided a lateral electrostatic discharge (ESD) protection device (40), comprising, a semiconductor substrate (42) of a first conductivity type and first doping level, a semiconductor layer (44) overlying the substrate (42), and of the first conductivity type and a second doping level equal or less than the first doping level and having an outer surface (46) spaced a first distance (45) from the substrate (42), emitter (48) and collector (50) regions of a second, opposite, conductivity type, laterally spaced apart by a second distance (52), and having third doping levels greater than the second doping level, a well region (54) of the first conductivity type in but not extending through the semiconductor layer (44) and having a doping level higher than the second doping level and extending laterally from the emitter region (48) toward but separated from the collector region (50) by a third distance (56), wherein the third distance (56) is in the range of about 0 to 3 micrometers, and a buried layer (49) of the second conductivity type and doping level higher than the third doping level Ohmically coupled to the emitter region (48) and having a lateral width substantially similar to a lateral width of the emitter region (48), and without a further buried layer (51) of the second conductivity type Ohmically coupled to the collector region (50), wherein a DC ESD trigger voltage $Vt1_{DC}$ and a transient ESD trigger voltage $Vt1_{TR}$ are within 25 percent of each other at any given spacing of the third distance (56). According to a further embodiment, the well region (44) has a depth (55) from the exterior surface toward the substrate (42) of about 30 to 60 percent of the first distance (45). According to a still further embodiment, the buried layer region (49) underlies the emitter region (48). According to a yet further embodiment, the emitter region (48) and the collector region (50) extend substantially through the semiconductor layer (44). According to a still yet further embodiment, the first conductivity type is N-type.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A lateral electrostatic discharge (ESD) protection device, comprising:
    a semiconductor substrate of a first conductivity type and first doping level;
    a semiconductor layer overlying the substrate, and of the first conductivity type and a second doping level and having an outer surface spaced a first distance from the substrate;
    emitter and collector regions of a second, opposite, conductivity type, laterally spaced apart by a second distance, and having third doping level greater than the second doping level;
    a well region of the first conductivity type in but not extending through the semiconductor layer and having a doping level higher than the second doping level but less than or equal to the third doping level, and extending laterally from the emitter region toward but separated from the collector region by a third distance; and
    a buried layer of the second conductivity type and doping level higher than the third doping level Ohmically coupled to the emitter region, and without a further buried layer of the second conductivity type Ohmically coupled to the collector region.

2. The device of claim 1, wherein the first conductivity type is N-type.

3. The device of claim 1, wherein the buried layer Ohmically coupled to the emitter region has a lateral width substantially similar to a lateral width of the emitter region.

4. The device of claim 1, wherein the well region has a depth from the exterior surface toward the substrate of about 30 to 60 percent of the first distance.

5. The device of claim 1, wherein the third distance is about 0 to 50 percent of the second distance.

6. The device of claim 1, wherein the third distance is in the range of about 0 to 3 micrometers.

7. The device of claim 1, wherein a DC ESD trigger voltage $Vt1_{DC}$ and a transient ESD trigger voltage $Vt1_{TR}$ differ in magnitude by less than about 25 percent of $Vt1_{TR}$.

8. The device of claim 1, wherein the buried layer region underlies the emitter region.

9. The device of claim 1, wherein the emitter region and the collector region extend substantially through the semiconductor layer.

10. A lateral bipolar electrostatic discharge (ESD) protection device having a trigger voltage Vt1, comprising:
    a semiconductor (SC) substrate;
    an overlying epitaxial SC layer;
    emitter-collector regions in the SC layer, laterally spaced apart by a first distance;
    a base region adjacent the emitter region in the epitaxial SC layer extending laterally toward and separated from the collector region by a base-collector spacing in the epitaxial layer, which base-collector spacing is chosen to set a predetermined ESD trigger voltage Vt1; and
    a buried layer region under the emitter region Ohmically coupled thereto, but without a comparable buried layer region under the collector region, thereby providing an asymmetrical structure whose DC trigger voltage ($Vt1_{DC}$) and transient trigger voltage ($Vt1_{TR}$) are approximately equal.

11. The device of claim 10, wherein the buried layer region extends laterally under the emitter region.

12. The device of claim 10, wherein the base-collector spacing is in the range of about 0 to 50 percent of the first distance.

13. The device of claim 10, wherein the epitaxial SC layer has a first thickness and the base region extends to a first depth from an outer surface of the epitaxial SC layer, which first depth is about 30 to 60 percent of the first thickness.

14. The device of claim 10, wherein the substrate has a first dopant concentration, the epitaxial layer has a second dopant concentration equal or less than the first dopant concentration and the base region has a third dopant concentration greater than the second dopant concentrations.

15. The device of claim 11, wherein the buried layer region is more heavily doped than the emitter region.

16. A lateral electrostatic discharge (ESD) protection device, comprising:
    a semiconductor substrate of a first conductivity type and first doping level;
    a semiconductor layer overlying the substrate, and of the first conductivity type and a second doping level equal or less than the first doping level and having an outer surface spaced a first distance from the substrate;

emitter and collector regions of a second, opposite, conductivity type, laterally spaced apart by a second distance, and having third doping levels greater than the second doping level;

a well region of the first conductivity type in but not extending through the semiconductor layer and having a doping level higher than the second doping level and extending laterally from the emitter region toward but separated from the collector region by a third distance, wherein the third distance is in the range of about 0 to 3 micrometers; and a buried layer of the second conductivity type and doping level higher than the third doping level Ohmically coupled to the emitter region and having a lateral width substantially similar to a lateral width of the emitter region, and without a further buried layer of the second conductivity type Ohmically coupled to the collector region, wherein a DC ESD trigger voltage $Vt1_{DC}$ and a transient ESD trigger voltage $Vt1_{TR}$ are within 25 percent of each other at any given spacing of the third distance.

17. The device of claim 16, wherein the well region has a depth from the exterior surface toward the substrate of about 30 to 60 percent of the first distance.

18. The device of claim 17, wherein the buried layer region underlies the emitter region.

19. The device of claim 18, wherein the emitter region and the collector region extend substantially through the semiconductor layer.

20. The device of claim 19, wherein the first conductivity type is N-type.

* * * * *